United States Patent
Jo et al.

(10) Patent No.: US 8,030,906 B2
(45) Date of Patent: Oct. 4, 2011

(54) SWITCHING POWER SOURCE APPARATUS AND CONTROL METHOD THEREOF

(75) Inventors: Sung-jo Jo, Suwon-si (KR); Jong-moon Choi, Seoul (KR); Jee-hoon Jung, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 690 days.

(21) Appl. No.: 12/133,591

(22) Filed: Jun. 5, 2008

(65) Prior Publication Data
US 2009/0051333 A1 Feb. 26, 2009

(30) Foreign Application Priority Data
Aug. 21, 2007 (KR) .................. 10-2007-0084068

(51) Int. Cl.
*G05F 1/00* (2006.01)
(52) U.S. Cl. ......... 323/222; 323/235; 323/271; 323/282
(58) Field of Classification Search .................. 323/222, 323/226, 270, 271, 282, 235
See application file for complete search history.

(56) References Cited

U.S. PATENT DOCUMENTS

| | | | | |
|---|---|---|---|---|
| 5,172,309 A | * | 12/1992 | DeDoncker et al. | 363/132 |
| 6,816,392 B2 | * | 11/2004 | Takamatsu | 363/21.15 |
| 7,705,571 B2 | * | 4/2010 | Motz | 323/268 |
| 7,812,575 B2 | * | 10/2010 | Shimada et al. | 323/222 |
| 2008/0186004 A1 | * | 8/2008 | Williams | 323/282 |

* cited by examiner

*Primary Examiner* — Adolf Berhane
*Assistant Examiner* — Nguyen Tran
(74) *Attorney, Agent, or Firm* — Staas & Halsey LLP

(57) ABSTRACT

A switching power source apparatus includes a storage unit to store energy obtained from input power supplied to the storage unit, and to output at least of the stored energy as output power; a first switch; a second switch connected in series with the first switch, the series connection of the first switch and the second switch being connected to the storage unit; and a voltage clamp unit to clamp a level of a voltage applied across the series connection of the first switch and the second switch to a predetermined voltage or less. The first switch is turned on while the second switch is still turned off, and then the second switch is turned on after the first switch has been turned on to supply the input power to the storage unit from the series connection of the first switch and the second switch.

20 Claims, 4 Drawing Sheets

SWITCHING POWER SOURCE APPARATUS AND CONTROL METHOD THEREOF

CROSS-REFERENCE TO RELATED APPLICATION

This application claims the benefit of Korean Patent Application No. 2007-84068 filed on Aug. 21, 2007, in the Korean Intellectual Property Office, the disclosure of which is incorporated herein by reference in its entirety.

BACKGROUND OF THE INVENTION

1. Field of the Invention

Aspects of the invention relate to a switching power source apparatus and a control method thereof, and more particularly to a zero voltage switching power source apparatus, and a control method thereof.

2. Description of the Related Art

A power source apparatus may be classified into a switching mode power source apparatus or a non-switching mode power source apparatus, such as a linear power source apparatus, depending on a DC voltage converting method. A non-switching mode power source apparatus has a low power efficiency, but a high stability. In contrast, a switching mode power source apparatus has a higher power efficiency, but a lower stability. Even though the switching mode power source apparatus has a lower stability than the non-switching mode power source apparatus, its higher power efficiency, coupled with recent improvements in stability, have resulted in an increase in the use of the switching mode power source apparatus in circuits.

A switching mode power source apparatus may be operated in a zero voltage switching mode, in which a switching operation is performed only when a voltage across the switch is zero, thereby minimizing a switching loss.

FIG. 1 is a detailed circuit diagram of a zero voltage switching power source apparatus according to the related art. As shown therein, a zero voltage switching power source apparatus 1 according to the related art includes a MOSFET (metal-oxide-semiconductor field-effect transistor) having a fast switching speed and having a diode connected in parallel with the MOSFET to clamp a voltage across the MOSFET to substantially zero. The MOSFET has a source terminal S, a drain terminal D, and a gate terminal G.

The diode of the MOSFET is turned on by a resonant operation of a resonant circuit formed by an inductor L and a capacitor C connected in parallel with the MOSFET and the diode. When a current starts to flow from the inductor L into the capacitor C during the resonant operation, the voltage across the capacitor is zero, and the diode is not conducting. As the current continues to flow into the capacitor, the capacitor charges up until the voltage across it exceeds the forward voltage of the diode, causing the diode to conduct. While the diode is conducting, the voltage drop across the diode remains at the forward voltage of the diode, which is about 0.7 V for a silicon diode, and about 0.3 V for a germanium diode, so that a voltage across the MOSFET becomes substantially zero, thereby enabling a zero voltage switching operation to be performed by a drive circuit that applies a control signal to the gate terminal G of the MOSFET to turn the MOSFET on or off. The voltage across the MOSFET remains at substantially zero until the direction of the current flow reverses during the resonant operation, causing the diode to stop conducting.

However, although the MOSFET has a fast switching speed, the design of the circuit in FIG. 1 requires the MOSFET to have a withstanding voltage, thereby increasing the cost of the MOSFET. Thus, the MOSFET is not practical for use as a switching element that requires a high withstanding voltage. Although a bipolar junction transistor (BJT) having a high withstanding voltage is less expensive than a MOSFET having a high withstanding voltage, the BJT has a slower switching speed, and thus is not practical for use as a switching element that requires a high switching speed.

SUMMARY OF THE INVENTION

Accordingly, an aspect of the invention is to provide a switching power source apparatus having a high withstanding voltage and a lower cost, and a control method thereof.

Another aspect of the invention is to provide a switching power source apparatus that reduces a load on a drive circuit compared to a zero voltage switching apparatus according to the related art, and a control method thereof.

Another aspect of the invention is to provide a switching power source apparatus having a faster turn-off speed compared to a switching apparatus having only a bipolar junction transistor (BJT), and a control method thereof.

According to an aspect of the invention, a switching power source apparatus includes a storage unit to store energy obtained from input power supplied to the storage unit, and to output at least some of the stored energy as output power; a first switch; a second switch connected in series with the first switch, the series connection of the first switch and the second switch being connected to the storage unit; and a voltage clamp unit to clamp a level of a voltage applied across the series connection of the first switch and the second switch to a predetermined voltage or less; wherein to supply the input power to the storage unit, the first switch is turned on while the second switch is still turned off, and then the second switch is turned on after the first switch has been turned on to supply the input power to the storage unit from the series connection of the first switch and the second switch.

According to an aspect of the invention, the second switch has a withstanding voltage equal to or greater than a predetermined value that is high enough to withstand a maximum voltage applied across the series connection of the first switch and the second switch during operation of the switching power source apparatus.

According to an aspect of the invention, the first switch includes a metal-oxide-semiconductor field-effect transistor (MOSFET).

According to an aspect of the invention, the second switch includes a bipolar junction transistor (BJT).

According to an aspect of the invention, the MOSFET includes a drain terminal; the BJT includes an emitter terminal; and the drain terminal of the MOSFET is connected to the emitter terminal of the BJT.

According to an aspect of the invention, the voltage clamp unit includes a diode connected to the series connection of the first switch and the second switch to conduct a current in a direction opposite to a direction of a current that flows from the series connection of the first switch and the second switches switch to the storage unit when the first switch and the second switch are turned on.

According to an aspect of the invention, the diode is connected in parallel with the series connection of the first switch and the second switch.

According to an aspect of the invention, turning off either the first switch or the second turns off the switching power source apparatus.

According to an aspect of the invention, the first switch includes a first capacitor; the second switch includes a second capacitor; and the first capacitor and the second capacitor form a resonant circuit with the storage unit.

According to an aspect of the invention, there is provided a method of controlling a switching power source apparatus, the switching power source apparatus including a storage unit to store energy obtained from input power supplied to the storage unit, and to output at least some of the stored energy as output power, a first switch, a second switch connected in series with the first switch, the series connection of the first switch and the second switch being connected to the storage unit, and a voltage clamp unit to clamp a level of a voltage applied across the series connection of the first switch and the second switch to a predetermined voltage or less, the method including clamping the level of the voltage applied across the series connection of the first switch and the second switch to a predetermined voltage or less with the voltage clamp circuit; turning on the first switch while the second switch is still turned off; and turning on the second switch after the first switch has been turned on to supply the input power to the storage unit from the series connection of the first switch and the second switch.

According to an aspect of the invention, a switching power source apparatus includes a storage unit to store energy, and to output at least some of the stored energy; a first switch having a first withstanding voltage; and a second switch having a second withstanding voltage higher than the first withstanding voltage, the second switch being connected in series with the first switch, the series connection of the first switch and the second switch being connected to the storage unit; wherein to supply the energy to the storage unit, the first switch is turned on while the second switch is still turned off and a voltage applied across the series connection of the first switch and the second switch is substantially zero, and then the second switch is turned on after the first switch has been turned on and while the voltage applied across the series connection of the first switch and the second switch is still substantially zero to supply the energy to the storage unit from the series connection of the first switch and the second switch.

Additional aspects and/or advantages of the invention will be set forth in part in the description that follows and, in part, will be obvious from the description, or may be learned by practice of the invention.

BRIEF DESCRIPTION OF THE DRAWINGS

The above and/or other aspects of the invention will become apparent and more readily appreciated from the following description of embodiments of the invention, taken in conjunction with the accompanying drawings of which.

DETAILED DESCRIPTION OF THE EMBODIMENTS

Figure 1:
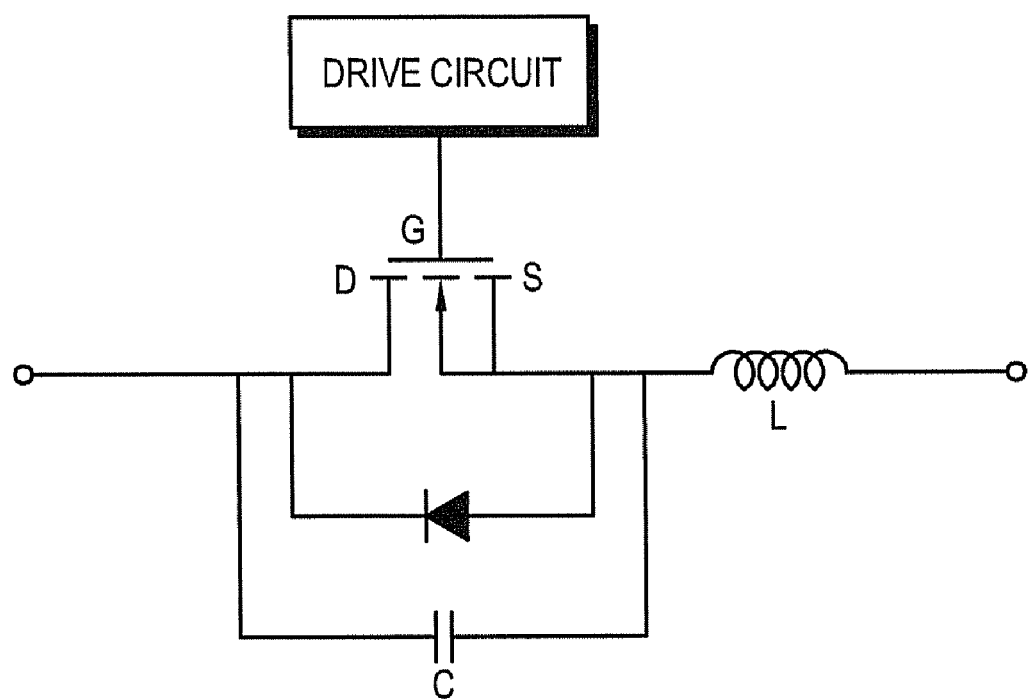
FIG. 1 is a detailed circuit diagram of a switching power source apparatus according to the related art.

Reference will now be made in detail to embodiments of the invention, examples of which are shown in the accompanying drawings, wherein like reference numerals refer to like elements throughout. The embodiments are described below in order to explain the invention by referring to the figures.

Figure 2:
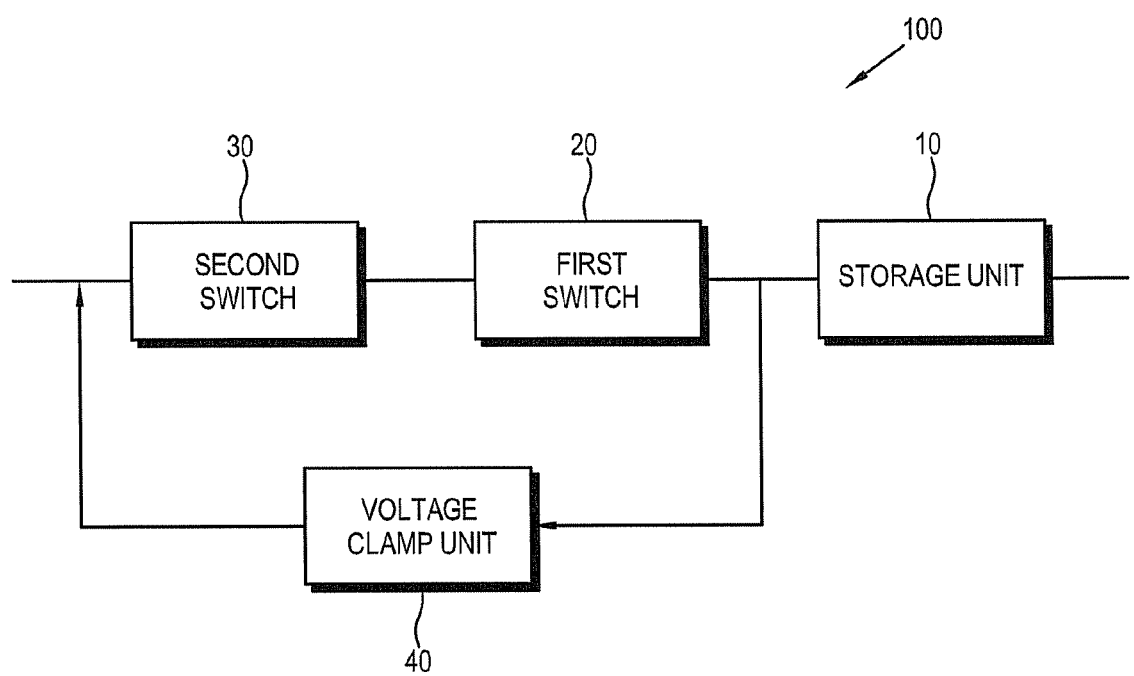
FIG. 2 is a block diagram of a switching power source apparatus according to an aspect of the invention.
Figure 3:
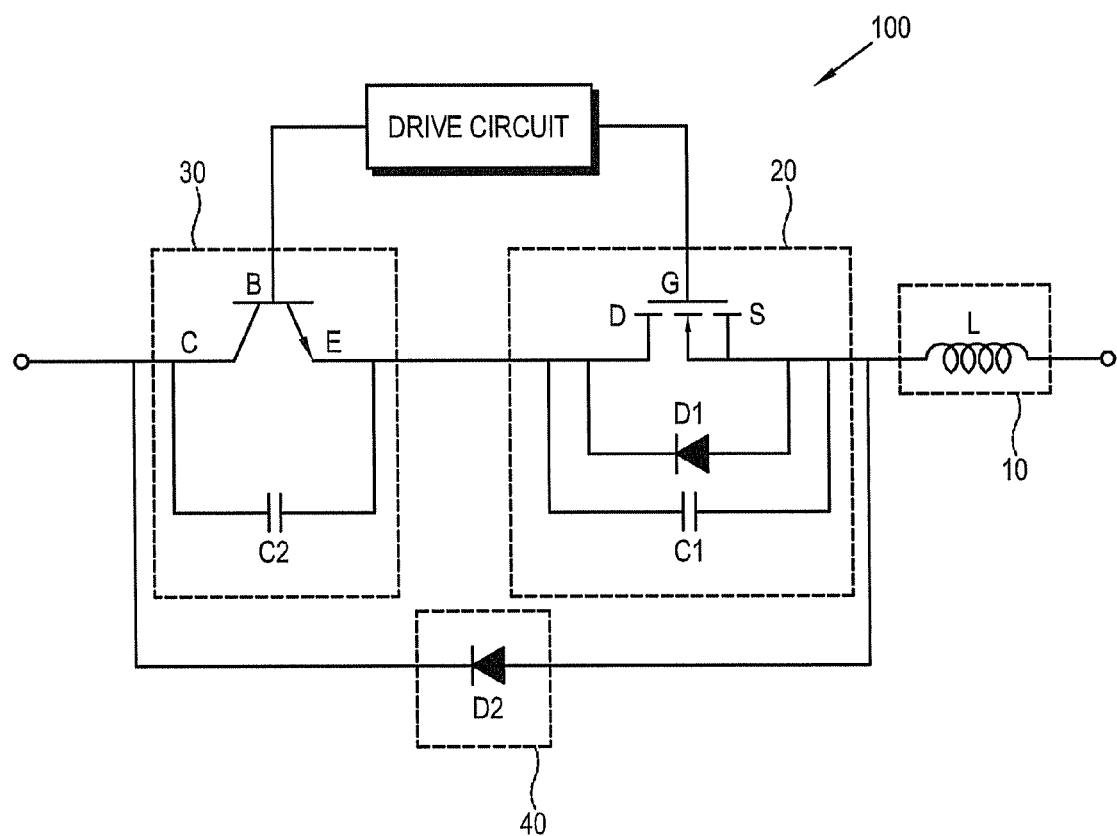
FIG. 3 is a detailed circuit diagram of the switching power source apparatus of FIG. 2 according to an aspect of the invention.

FIG. 2 is a block diagram of a switching power source apparatus according to an aspect of the invention. FIG. 3 is a detailed circuit diagram of the switching power source apparatus of FIG. 2 according to an aspect of the invention. As shown in FIG. 2, a switching power source apparatus 100 according to an aspect of the invention includes a storage unit 10, a first switch 20, a second switch 30, and a voltage clamp unit 40. Preferably, the switching power source apparatus 100 according to an aspect of the invention is a switching mode power supply (SMPS) that performs DC/DC conversion. However, it is understood that other types of switching power source apparatuses may be used as the switching power source apparatus 100, and that the switching power source apparatus 100 may perform other types of conversion, such as AC/DC conversion, DC/AC conversion, or AC/AC conversion.

The storage unit 10 stores energy supplied from an input power source (not shown) connected to an input terminal of the second switch 30 on the left side of FIGS. 2 and 3, and outputs at least some of the stored energy as output power to a load (not shown) connected to an output terminal of the storage unit 10 on the right side of FIGS. 2 and 3. The storage unit 10 according to an aspect the invention includes an inductor L to store energy, but the invention is not limited to such a storage unit 10. Alternatively, the storage unit 10 may include a converter that converts a voltage level of power, such as a transformer. Such a transformer also acts as an inductor L that stores energy.

As shown in FIG. 3, the first switch 20 according to an aspect of the invention preferably includes a MOSFET (metal-oxide-semiconductor field-effect transistor) having a fast switching speed, and having an integrated diode D1 connected in parallel with the MOSFET to clamp a voltage across the MOSFET to substantially zero. The MOSFET has a source terminal S, a drain terminal D, and a gate terminal G.

The second switch 30 is connected in series with the first switch 20. The second switch 30 according to an aspect of the invention preferably includes a BJT (bipolar junction transistor) having a withstanding voltage equal to or greater than a predetermined value that is high enough to withstand a maximum voltage applied across the series connection of the first switch 20 and the second switch 30 during operation of the switching power source apparatus 100. The BJT has an emitter terminal E, a collector terminal C, and a base terminal B.

As shown in FIG. 3, the first switch 20 and the second switch 30 are connected in a cascode circuit in which the drain terminal D of the first switch 20 is connected to the emitter terminal E of the second switch 30.

The first switch 20 includes a capacitor C1 connected in parallel with the MOSFET, and the second switch 30 includes a capacitor C2 connected in parallel with the BJT. As can be seen in FIG. 3, the first capacitor C1 and the second capacitor C2 are connected in series. The series connection of the first capacitor C1 and the second capacitor C2 forms a resonant circuit with the inductor L of the storage unit 10.

Before power is supplied to the storage unit 10, both the first switch 20 and the second switch 30 are in the off state. In order to supply power to the storage unit 10, the drive circuit applies a signal to the gate terminal G of the MOSFET of the first switch 20 to turn on the first switch 20 while the second switch 30 is still turned off. Then, the drive circuit applies a signal to the base terminal B of the BJT of the second switch 30 to turn on the second switch 30 after the first switch 20 has been turned on to supply power to the storage unit 10 from the series connection of the first switch 20 and the second switch 30.

The switching power source apparatus 100 according to an aspect of the invention has a high withstanding voltage provided by the second switch 30 is high enough to withstand the maximum voltage applied across the series connection of the first switch 20 and the second switch 30 during operation of the switching power source apparatus 100. This enables the MOSFET of the first switch 20 to have a withstanding voltage that is not high enough to withstand the maximum voltage applied across the series connection of the first switch 20 and the second switch 30 during operation of the switching power source apparatus 100, thereby decreasing the cost of the MOSFET.

Thus, the switching power source apparatus 100 not only reduces a load on the drive circuit connected to a base terminal B of the second switch 30, but also operates at a frequency of about 100 kHz, i.e. in a frequency band of a typical switching power source apparatus, due to the resonant operation of the resonant circuit formed by the inductance L, the capacitor C1 of the first switch 20, and the capacitor C2 of the second switch 30, even though a switching frequency of the second switch 30 is relatively low.

Only one of the first switch 20 and the second 30 needs to be turned off to turn off the switching power source apparatus 100, thereby providing a turn-off speed comparable to a switching power source apparatus according to the related art having a first switch 20 alone.

The voltage clamp unit 40 clamps a voltage applied across the series connection of the first switch 20 and the second switch 30 to a predetermined voltage or less. As shown in FIG. 3, the voltage clamp unit 40 according to an aspect of the invention may include a diode D2 that conducts current in a direction opposite to a direction of a current that flows from the series connection of the first switch 20 and the second switch 30 to the storage unit 10. Preferably, the diode D2 is connected in parallel with the series connection of the first switch 20 and the second switch 30. If the diode D2 is a silicon diode, the predetermined voltage will be a forward voltage of the silicon diode, which is about 0.7 V. If the diode D2 is a germanium diode, the predetermined voltage will be a forward voltage of the germanium diode, which is about 0.3 V.

Thus, the switching power source apparatus 100 according to an aspect of the invention may have a high withstanding voltage and a lower cost, and may reduce a load on the drive circuit, compared to the zero voltage switching apparatus according to the related art.

Figure 4:
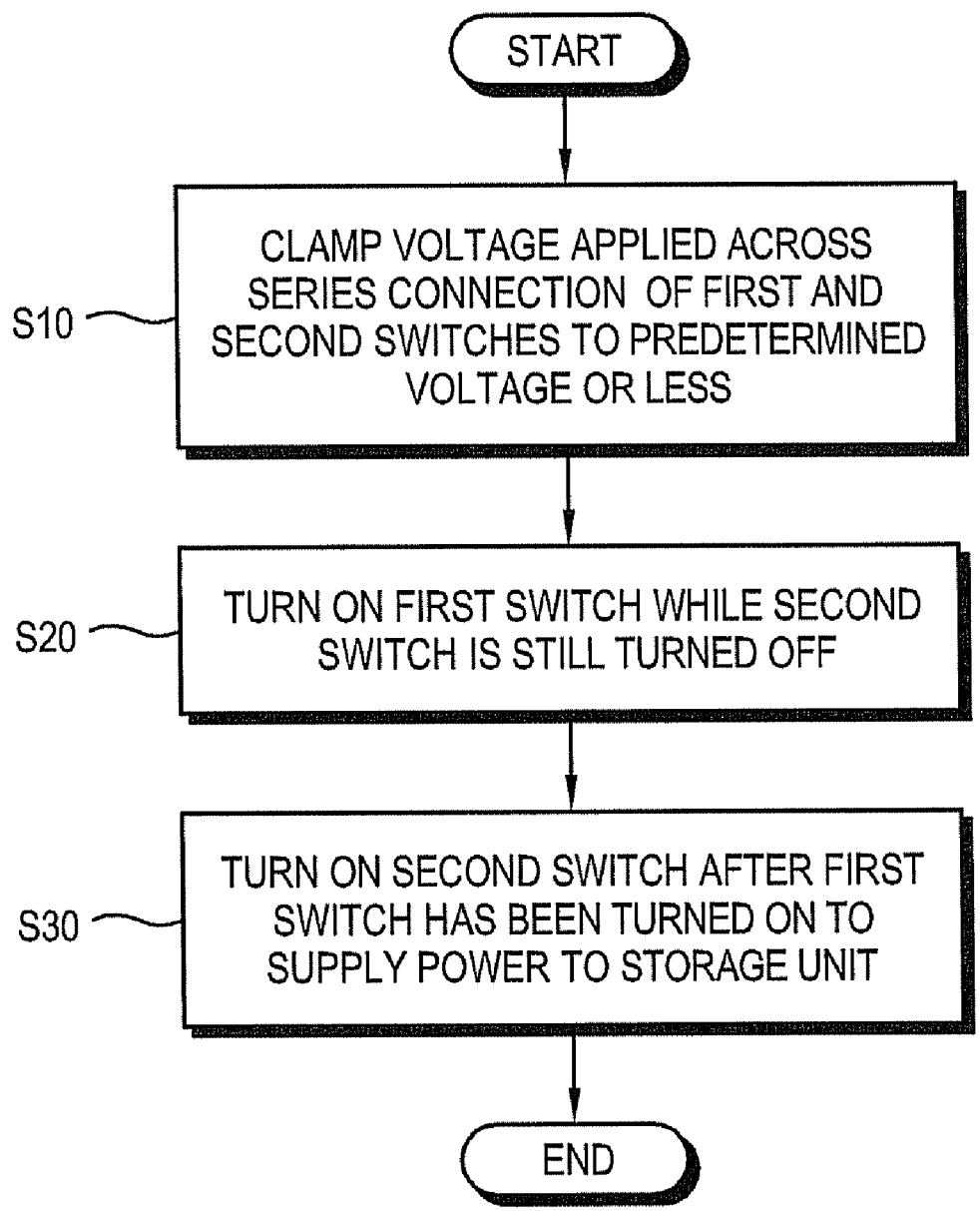
FIG. 4 is a flowchart of a control method of a switching power source apparatus according to an aspect of the invention.

A control method of the switching power source apparatus 100 according to an aspect of the invention will now be described with reference to FIG. 4.

First, the voltage clamp unit 40 clamps the voltage applied across the series connection of the first switch 20 and the second switch 30 to the predetermined voltage or less (S10). The first switch 20 is turned on while the second switch 30 is still turned off (S20).

The second switch 30, which is connected in series with the first switch 20, is turned on after the first switch 20 has been turned on to supply power to the storage unit 10 (S30).

In the operation S10, the diode D2 preferably conducts a current in a direction opposite to that of a current supplied from the series connection of the first switch 20 and the second switch 30 to the storage unit 10. The operation S10 may include an operation of turning off the switching power source apparatus 100 by turning off either the first switch 20 or the second switch 30.

Thus, a switching power source apparatus according to an aspect of the invention has a high withstanding voltage and a lower cost, and reduces a load on a drive circuit, compared to a zero voltage switching apparatus according to the related art.

As described above, aspects of the invention relate to a switching power source apparatus having a high withstanding voltage and a lower cost, and a control method thereof.

Also, aspects of the invention relate to a switching power source apparatus that reduces a load on a drive circuit compared to a zero voltage switching apparatus according to the related art, and a control method thereof.

Also, aspects of the invention relate to a switching power source apparatus having an improved turn-off speed compared to a zero voltage switching apparatus according to the related art having only a BJT (bipolar junction transistor) and a control method thereof.

Although several embodiments of the invention have been shown and described, it would be appreciated by those skilled in the art that changes may be made in these embodiments without departing from the principles and spirit of the invention, the scope of which is defined in the claims and their equivalents.

What is claimed is:

1. A switching power source apparatus, comprising:
   a storage unit to store energy obtained from input power supplied to the storage unit, and to output at least some of the stored energy as output power;
   a first switch;
   a second switch connected in series with the first switch, the series connection of the first switch and the second switch being connected to the storage unit; and
   a voltage clamp unit to clamp a level of a voltage applied across the series connection of the first switch and the second switch to a predetermined voltage or less,
   wherein to supply the input power to the storage unit, the first switch is turned on while the second switch is still turned off, and then the second switch is turned on after the first switch has been turned on to supply the input power to the storage unit from the series connection of the first switch and the second switch, and
   wherein the second switch has a withstanding voltage equal to or greater than a predetermined value that is high enough to withstand a maximum voltage applied across the series connection of the first switch and the second switch during operation of the switching power source apparatus.

2. The switching power source apparatus of claim 1, wherein the first switch comprises a metal-oxide-semiconductor field-effect transistor (MOSFET).

3. The switching power source apparatus of claim 2, wherein the second switch comprises a bipolar junction transistor (BJT).

4. The switching power source apparatus according to claim 3, wherein:
   the MOSFET comprises a drain terminal;
   the BJT comprises an emitter terminal; and
   the drain terminal of the MOSFET is connected to the emitter terminal of the BJT.

5. A switching power source apparatus, comprising:
   a storage unit to store energy obtained from input power supplied to the storage unit, and to output at least some of the stored energy as output power;
   a first switch;
   a second switch connected in series with the first switch, the series connection of the first switch and the second switch being connected to the storage unit; and a voltage clamp unit to clamp a level of a voltage applied across the series connection of the first switch and the second switch to a predetermined voltage or less, wherein to supply the input power to the storage unit, the first switch is turned on while the second switch is still turned off, and then the second switch is turned on after the first switch has been turned on to supply the input power to the storage unit from the series connection of the first switch and the second switch, and wherein the voltage clamp unit comprises a diode connected to the series connection of the first switch and the second switch to conduct a current in a direction opposite to a direction of a current that flows from the series connection of the first switch and the second switch to the storage unit when the first switch and the second switch are turned on.

6. The switching power source apparatus of claim 5, wherein the diode is connected in parallel with the series connection of the first switch and the second switch.

7. The switching power source apparatus of claim 1, wherein turning off either the first switch or the second switch turns off the switching power source apparatus.

8. The switching power source apparatus of claim 1, wherein:
the first switch comprises a first capacitor;
the second switch comprises a second capacitor; and
the first capacitor and the second capacitor form a resonant circuit with the storage unit.

9. A method of controlling a switching power source apparatus, the switching power source apparatus comprising a storage unit to store energy obtained from input power supplied to the storage unit, and to output at least some of the stored energy as output power, a first switch, a second switch connected in series with the first switch, the series connection of the first switch and the second switch being connected to the storage unit, and a voltage clamp unit to clamp a level of a voltage applied across the series connection of the first switch and the second switch to a predetermined voltage or less, the method comprising:
clamping the level of the voltage applied across the series connection of the first switch and the second switch to a predetermined voltage or less with the voltage clamp unit;
turning on the first switch on while the second switch is still turned off; and
turning on the second switch after the first switch has been turned on to supply the input power to the storage unit from the series connection of the first switch and the second switch,
wherein the second switch has a withstanding voltage equal to or greater than a predetermined value that is high enough to withstand a maximum voltage applied across the series connection of the first switch and the second switch during operation of the switching power source apparatus.

10. The method of claim 9, wherein the first switch comprises a metal-oxide-semiconductor field-effect transistor (MOSFET).

11. The method of claim 10, wherein the second switch comprises a bipolar junction transistor (BJT).

12. The method of claim 11, wherein:
the MOSFET comprises a drain terminal;
the BJT comprises an emitter terminal; and
the drain terminal of the MOSFET is connected to the emitter terminal of the BJT.

13. A method of controlling a switching power source apparatus, the switching power source apparatus comprising a storage unit to store energy obtained from input power supplied to the storage unit, and to output at least some of the stored energy as output power, a first switch, a second switch connected in series with the first switch, the series connection of the first switch and the second switch being connected to the storage unit, and a voltage clamp unit to clamp a level of a voltage applied across the series connection of the first switch and the second switch to a predetermined voltage or less, the method comprising:
clamping the level of the voltage applied across the series connection of the first switch and the second switch to a predetermined voltage or less with the voltage clamp unit;
turning on the first switch on while the second switch is still turned off; and
turning on the second switch after the first switch has been turned on to supply the input power to the storage unit from the series connection of the first switch and the second switch,
wherein the voltage clamp unit comprises a diode connected to the series connection of the first switch and the second switch to conduct a current in a direction opposite to a direction of a current that flows from the series connection of the first switch and the second switch to the storage unit when the first switch and the second switch are turned on.

14. The method of claim 9, further comprising turning off either the first switch or the second switch to turn off the switching power source apparatus.

15. The method of claim 9, wherein:
the first switch comprises a first capacitor;
the second comprises a second capacitor; and
the first capacitor and the second capacitor form a resonant circuit with the storage unit.

16. A switching power source apparatus comprising:
a storage unit to store energy, and to output at least some of the stored energy;
a first switch having a first withstanding voltage; and
a second switch having a second withstanding voltage higher than the first withstanding voltage, the second switch being connected in series with the first switch, the series connection of the first switch and the second switch being connected to the storage unit,
wherein to supply the energy to the storage unit, the first switch is turned on while the second switch is still turned off and a voltage applied across the series connection of the first switch and the second switch is substantially zero, and then the second switch is turned on after the first switch has been turned on and while the voltage applied across the series connection of the first switch and the second switch is still substantially zero to supply the energy to the storage unit from the series connection of the first switch and the second switch, and
wherein the first withstanding voltage is not high enough to withstand a maximum voltage applied across the series connection of the first switch and the second switch during operation of the switching power source apparatus.

17. A switching power source apparatus comprising:
a storage unit to store energy, and to output at least some of the stored energy;
a first switch having a first withstanding voltage; and
a second switch having a second withstanding voltage higher than the first withstanding voltage, the second switch being connected in series with the first switch, the series connection of the first switch and the second switch being connected to the storage unit, wherein to supply the energy to the storage unit, the first switch is turned on while the second switch is still turned off and a voltage applied across the series connection of the first switch and the second switch is substantially zero, and then the second switch is turned on after the first switch has been turned on and while the voltage applied across the series connection of the first switch and the second switch is still substantially zero to supply the energy to the storage unit from the series connection of the first switch and the second switch, and wherein the second withstanding voltage is high enough to withstand a maximum voltage applied across the series connection of the first switch and the second switch during operation of the switching power source apparatus.

18. A switching power source apparatus comprising:

a storage unit to store energy, and to output at least some of the stored energy;

a first switch having a first withstanding voltage; and a second switch having a second withstanding voltage higher than the first withstanding voltage, the second switch being connected in series with the first switch, the series connection of the first switch and the second switch being connected to the storage unit, wherein to supply the energy to the storage unit, the first switch is turned on while the second switch is still turned off and a voltage applied across the series connection of the first switch and the second switch is substantially zero, and then the second switch is turned on after the first switch has been turned on and while the voltage applied across the series connection of the first switch and the second switch is still substantially zero to supply the energy to the storage unit from the series connection of the first switch and the second switch, wherein the first switch comprises a metal-oxide-semiconductor field-effect transistor (MOSFET) and the second switch comprises a bipolar junction transistor (BJT), wherein the first switch further comprises a first capacitor, the second switch further comprises a second capacitor, and the first capacitor and the second capacitor form a resonant circuit with the storage unit, and wherein the storage unit comprises an inductance, the first capacitor is connected in parallel with the MOSFET, the second capacitor is connected in parallel with the BJT and in series with the first capacitor, and the first capacitor and the second capacitor form the resonant circuit with the inductance of the storage unit.

19. The switching power source apparatus of claim 18, wherein:

the first switch further comprises a diode connected in parallel with the MOSFET; and the diode is turned on by a resonant operation of the resonant circuit.

20. A switching power source apparatus comprising:

a storage unit to store energy, and to output at least some of the stored energy;

a first switch having a first withstanding voltage;

a second switch having a second withstanding voltage higher than the first withstanding voltage, the second switch being connected in series with the first switch, the series connection of the first switch and the second switch being connected to the storage unit; and a voltage clamp unit to clamp the voltage applied across the series connection of the first switch and the second switch to a substantially zero voltage, wherein to supply the energy to the storage unit, the first switch is turned on while the second switch is still turned off and a voltage applied across the series connection of the first switch and the second switch is substantially zero, and then the second switch is turned on after the first switch has been turned on and while the voltage applied across the series connection of the first switch and the second switch is still substantially zero to supply the energy to the storage unit from the series connection of the first switch and the second switch, wherein the voltage clamp unit comprises a diode connected across the series connection of the first switch and the second switch to conduct a current in a direction opposite to a direction of a current that flows from the series connection of the first switch and the second switch to the storage unit when the first switch and the second switch are turned on, and wherein the substantially zero voltage is a forward voltage of the diode.

* * * * *

UNITED STATES PATENT AND TRADEMARK OFFICE
CERTIFICATE OF CORRECTION

PATENT NO. : 8,030,906 B2
APPLICATION NO. : 12/133591
DATED : October 4, 2011
INVENTOR(S) : Sung-jo Jo It is certified that error appears in the above-identified patent and that said Letters Patent is hereby corrected as shown below:

Column 8, Line 32, In Claim 15, after "second" insert -- switch --.

Signed and Sealed this
Twenty-ninth Day of May, 2012

David J. Kappos
*Director of the United States Patent and Trademark Office*